United States Patent
Ortiz et al.

(10) Patent No.: US 9,940,414 B2
(45) Date of Patent: Apr. 10, 2018

(54) TOTAL ASSET MODELING WITH INTEGRATED ASSET MODELS AND PERSISTENT ASSET MODELS

(71) Applicant: Landmark Graphics Corporation, Houston, TX (US)

(72) Inventors: Thomas Manual Ortiz, Houston, TX (US); Ronald Gordon Cude, Houston, TX (US); Olivier Roger Germain, Houston, TX (US); Laurence Reid, Cypress, TX (US)

(73) Assignee: Landmark Graphics Corporation, Houston, TX (US)

( * ) Notice: Subject to any disclaimer, the term of this patent is extended or adjusted under 35 U.S.C. 154(b) by 108 days.

(21) Appl. No.: 14/760,688

(22) PCT Filed: Feb. 24, 2014

(86) PCT No.: PCT/US2014/018038
§ 371 (c)(1),
(2) Date: Jul. 13, 2015

(87) PCT Pub. No.: WO2015/126423
PCT Pub. Date: Aug. 27, 2015

(65) Prior Publication Data
US 2016/0357887 A1    Dec. 8, 2016

(51) Int. Cl.
G06F 17/50 (2006.01)
G06Q 10/06 (2012.01)
E21B 41/00 (2006.01)
G06Q 50/08 (2012.01)

(52) U.S. Cl.
CPC .......... *G06F 17/5009* (2013.01); *E21B 41/00* (2013.01); *G06Q 10/067* (2013.01); *G06Q 50/08* (2013.01)

(58) Field of Classification Search
CPC .... G06F 17/5009; E21B 41/00; G06Q 10/067
USPC .......................................................... 703/10
See application file for complete search history.

(56) References Cited

U.S. PATENT DOCUMENTS

| | | | |
|---|---|---|---|
| 6,671,818 B1 | 12/2003 | Mikurak | |
| 7,395,252 B2 | 7/2008 | Anderson | |
| 7,512,543 B2 | 3/2009 | Raghuraman | |
| 7,539,625 B2 * | 5/2009 | Klumpen et al. .... | G05B 19/418 705/8 |
| 7,584,165 B2 | 9/2009 | Buchan | |
| 8,195,401 B2 | 6/2012 | Ella et al. | |

(Continued)

FOREIGN PATENT DOCUMENTS

| | | |
|---|---|---|
| CA | 2639313 | 3/2009 |
| WO | 2013085689 A1 | 6/2013 |
| WO | 2013052725 A1 | 11/2013 |

OTHER PUBLICATIONS

Lam, Benjamin; Patent Examination Report No. 1; dated Aug. 25, 2016; 3 pages; Patent Application No. 2014383132; Australian Intellectual Property Office; Australia.

(Continued)

*Primary Examiner* — Saif A Alhija
(74) *Attorney, Agent, or Firm* — Polsinelli PC

(57) ABSTRACT

Systems and methods for total asset modeling by updating a preexisting integrated asset model in the form of a unique type model during different stages of an asset lifecycle to identify and evaluate a new asset during the asset lifecycle.

19 Claims, 8 Drawing Sheets

(56) References Cited

U.S. PATENT DOCUMENTS

| | | | |
|---|---|---|---|
| 8,280,635 | B2 | 10/2012 | Ella et al. |
| 2001/0042642 | A1 | 11/2001 | King |
| 2004/0088236 | A1 | 5/2004 | Manning |
| 2004/0220790 | A1 | 11/2004 | Cullick et al. |
| 2005/0182709 | A1 | 8/2005 | Belcsak et al. |
| 2008/0133550 | A1 | 6/2008 | Orangi et al. |
| 2008/0215474 | A1 | 9/2008 | Graham |
| 2010/0185428 | A1 | 7/2010 | Vink |
| 2011/0071963 | A1 | 3/2011 | Piovesan et al. |

OTHER PUBLICATIONS

Commissioner; International Search Report and the Written Opinion of the International Searching Authority; PCT/US14/18038; dated May 21, 2015; 10 pgs.; ISA/KR.
Commissioner; International Search Report and the Written Opinion of the International Searching Authority; PCT/US14/18063; dated Nov. 24, 2014; 12 pgs.; ISA/KR.
Chen, Wei; Multistage Stochastic Programming Models for the Portfolio Optimization of Oil Projects; Dissertation for the degree of Ph.D.; The University of Texas at Austin; Dec. 20, 2011; pp. 1-238.
Mouton, Daniel Marais; Focussed Growth: The Development of a System to Rank and Prioritise New Capital Projects of Mining Companies; Research Report for the degree of MBA; The University of Stellenbosch; Dec. 2010; pp. 1-106.
Reid, Ella R., et al.; "The Central Role and Challenges of Integrated Production Operations", SPE Paper 99807-MS, Presented at the Intelligent Energy Conference and Exhibition, Apr. 11-13, 2006; pp. 1-16; Amsterdam, The Netherlands.
Sankaran, "The Promise & Challenges of Digitial Oilfield Solutions: Lessons Learned from Global Implementations and Future Directions", SPE Paper 122855-MS, Presented at the SPE Digital Energy Conference and Exhibition, Apr. 7-8, 2009, Houston, TX.
Liao, T.T., et al., "Development and Applications of Sustaining Integrated Asset Modeling Tool", SPE Paper 88748, Presented at the 11th Abu Dhabi International Petroleum Exhibition and Conference, Oct. 10-13, 2004; pp. 1-8.
Chow, C.V., et al., "Managing Risks Using Integrated Production Models: Process Description", Journal of Petroleum Technology, Mar. 2000, p. 54-57.
Zapata, V. J., et al., "Advances in Tightly Coupled Reservoir/Wellbore/Surface Network Simulation", SPE Reservoir Evaluation and Engineering, Apr. 2001, p. 114-120.
Moitra, S.K., et al., "A Field-Wide Integrated Production Model and Asset Management System for the Mumbai High Field", Paper OTC-18678-PP, Presented at the 2007 Offshore Technology Conference, Houston, TX, pp. 1-12.
Nikolaou, M., et al., "Production Optimization—A Moving Horizon Approach", SPE Paper 99358, Presented at the 2006 SPE Intelligent Energy Conference and Exhibition, Amsterdam, The Netherlands, Apr. 11-13, 2006; pp. 1-13.
Soma, R., et al., "A Service Oriented Data Composition Architecture for Integrated Asset Management", SPE Paper 99983, Presented at the 2006 SPE Intelligent Energy Conference and Exhibition, Amsterdam, The Netherlands, Apr. 11-13, 2006; pp. 1-8.
Woodhead, T., "Development of a Generic Life-Cycle Modeling Tool", SPE Paper 102948, Presented at the 2006 SPE Annual Technical Conference and Exhibition, San Antonio, TX, Sep. 24-27, 2006, pp. 1-10.
Mallet, J., et al., "New modelling technology delivers consistency", First Break, v. 28, Oct. 2010; pp. 93-96.
Van Den Hof, P. M. J., et al., "Recent developments in model-based optimization and control of subsurface flow in oil reservoirs", Proceedings of the IFAC Workshop on Automatic Control in Offshore Oil and Gas Production 2012, May 31-Jun. 1, 2012, Trondheim, Norway, pp. 189-200.
Livia Wiley, Gaining Value Through Integrated Upstream Asset Management, Mar. 9, 2015, 3 pages, Oil Gas Monitor, United States.
Dr. Y Serdar Dogulu and Rick Squires, Commercial Awareness of the Oil and Gas Value Chain: A Challenging Simulation Program, Jun. 7, 2015, 4 pages, IHRDC Energy Business Workshops, Kuwait.
Schlumberger, Avocet Production Operations Software Platform, Aug. 13, 2013, 1 page, Software Schlumberger, United States.
Schlumberger, Avocet Integrated Asset Modeler 2013.1 Now Available, Dec. 16, 2013, 1 page, Software Schlumberger, United States.
Calabrese, Raffaele; Response to Third Exam Report; dated Nov. 8, 2016; 3 pages; Australian Patent Application No. 2014383132; Phillips, Orrnonde & Fitzpatrick; Melbourne, Australia.
Lam, Benjjamin; Patent Examination Report No. 3; dated Oct. 7, 2016; 3 pages; Australian Patent Application No. 2014383132; Intellectual Property Australian Government; Australia.
Rajagopal, Umarani; Written Opinion; dated Nov. 3, 2016; 7 page; Patent Application No. 11201605674X; IPOS; Singapore.
Matheson, Leigh; Office Action; dated Sep. 7, 2016; 6 pages; Patent Application No. 2,937,221; Canadian Intercultural Property Office; Montreal, Quebec, Canada.

\* cited by examiner

Depth

Reservoirs Wells Surface Facilities

TOTAL ASSET MODELING WITH INTEGRATED ASSET MODELS AND PERSISTENT ASSET MODELS

CROSS-REFERENCE TO RELATED APPLICATIONS

This application claims the priority of PCT Patent Application No. PCT/US14/18038, filed on Feb. 24, 2014, which is incorporated herein by reference. This application and U.S. patent application Ser. No. 14/891,252, which is incorporated by reference, are commonly assigned to Landmark Graphics Corporation.

STATEMENT REGARDING FEDERALLY SPONSORED RESEARCH

Not applicable.

FIELD OF THE DISCLOSURE

The present disclosure generally relates to systems and methods for total asset modeling with integrated asset models and persistent asset models. More particularly, the present disclosure relates to total asset modeling by updating a preexisting integrated asset model in the form of a unique type model during different stages of an asset lifecycle to identify and evaluate a new asset during the asset lifecycle.

BACKGROUND

Managing the full lifecycle of an oil and gas field asset (hereinafter "asset") involves making decisions concerning the project (e.g. development of all components required to produce oil and/or gas from the asset) based on limited information to more information that corresponds with high uncertainty to lower uncertainty, respectively. These decisions occur at key stages of the asset lifecycle and have the potential to influence the value of the asset. The potential impact of early and then successive decisions can either increase or decrease the value of the asset. It is therefore, important that these decisions are optimized over the lifecycle of the asset as soon as possible when new information is discovered that allows a significant reduction of uncertainty and a measurable improvement in the financial outcome of a decision.

It is well understood that a conventional integrated-asset-model (IAM), which is illustrated in FIG. 6 and models the asset from the bottom of the reservoir to a surface facility, must be updated to reflect current reservoir, well, and surface facility conditions; otherwise, it loses its value. Each IAM may include a reservoir model, well models, surface facility models and economic models. Equally important for asset owners is maintenance of their models over time, which is commonly referred to as a persistent asset model (PAM) and is illustrated in FIG. 7. The conventional approach to PAM, using disjoint models created at different stages of an asset's lifecycle, is a time-consuming, piecemeal strategy that produces less accurate results. Furthermore, integration of the IAM and PAM remains a goal that has still not been reached by most operators. One reason maintenance of an IAM over time is difficult is that many different people from a variety of functional areas create models of an asset at different times for different purposes. These models are, evidently, quite different and often challenging to reconcile with one another. A related cause of difficulty in IAM lifecycle maintenance is the fact that different amounts and/or types of data are available at different stages in the lifecycle of an asset because information accrues over time allowing later (e.g. production) stage models to be more sophisticated than those created at the appraisal and development stages. Therefore, lifecycle maintenance of an IAM must involve reconciliation of varied descriptions of an asset, each containing successively greater amounts of data at finer levels of granularity as the asset progresses through the different stages of its development (e.g. acquire, evaluate, appraise, select, define, execute, produce).

BRIEF DESCRIPTION OF THE DRAWINGS

The present disclosure is described below with references to the accompanying drawings in which like elements are referenced with like reference numerals, and in which.

DETAILED DESCRIPTION OF THE PREFERRED EMBODIMENTS

Figure 1:
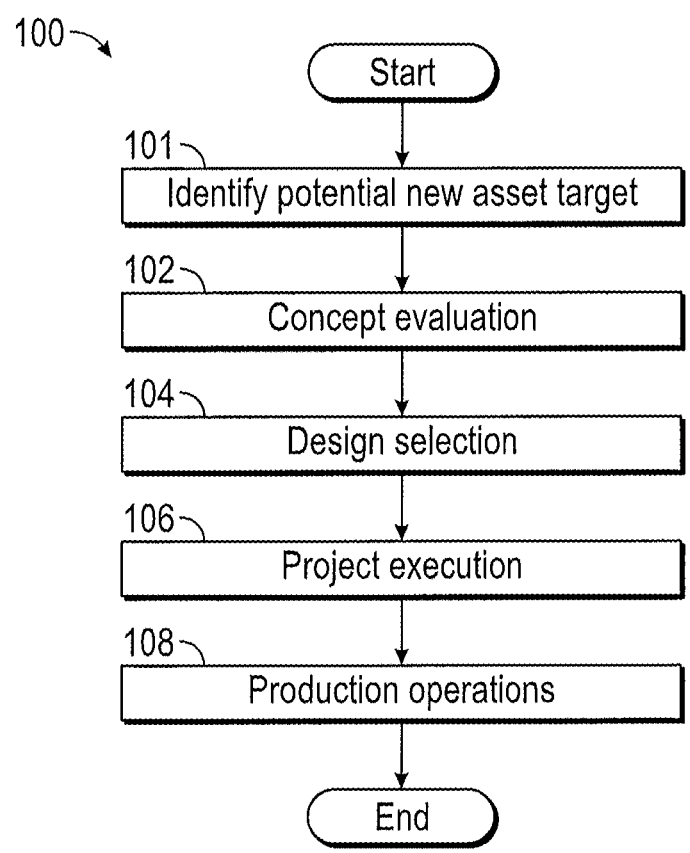
FIG. 1 is a flow diagram illustrating one embodiment of a method for implementing the present disclosure.

The present disclosure overcomes one or more deficiencies in the prior art by providing systems and methods for total asset modeling by updating a preexisting integrated asset model in the form of a unique type model during different stages of an asset lifecycle to identify and evaluate a new asset during the asset lifecycle.

In one embodiment, the present disclosure includes a method for selecting an engineering design scenario for a potential asset target by total asset modeling, which comprises: i) generating a list of potential conceptual engineering design scenarios for the potential asset target; ii) associating a unique type model with each potential conceptual engineering design scenario wherein, wherein each type model includes one or more economic variables and one or more technical variables; iii) updating each type model using a computer processor by at least one of adjusting each technical variable and each economic variable for the respective type model according to currently available economic data and technical data that is related to a respective adjusted variable and adding at least one of one or more economic variables and one or more technical variables to the respective type model according to the currently available economic data and technical data that is related to a respective added variable; iv) refining each updated type model by adjusting each technical variable and each economic variable for the respective updated type model according to a technical feasibility analysis for the respective potential conceptual engineering design scenario that is related to a respective adjusted variable; v) identifying one or more potential conceptual engineering design scenarios that are technically feasible and economical according to the respective technical feasibility analysis and a respective ranked net present value, wherein each identified potential conceptual engineering design scenario represents a technically feasible, economical scenario; vi) re-updating each refined type model associated with a respective technically feasible, economical scenario by at least one of adjusting each technical variable and each economic variable for the respective refined type model according to any additional economic data and technical data that is related to a respective adjusted variable and adding at least one of one or more economic variables and one or more technical variables to the respective refined type model according to any additional economic data and technical data that is related to a respective added variable; vii) updating each ranked net present value for the respective technically feasible, economical scenario; and viii) selecting a best profitable engineering design scenario from the technically feasible, economical scenarios based on at least one of the respective updated net present value and a respective acceptable project bid from a contractor that includes a project timeline estimate for developing components required to produce at least one of oil and gas from the potential asset target.

In another embodiment, the present disclosure includes a non-transitory program carrier device tangibly carrying computer-executable instructions for selecting an engineering design scenario for a potential asset target by total asset modeling, the instructions being executable to implement: i) generating a list of potential conceptual engineering design scenarios for the potential asset target; ii) associating a unique type model with each potential conceptual engineering design scenario wherein, wherein each type model includes one or more economic variables and one or more technical variables; iii) updating each type model by at least one of adjusting each technical variable and each economic variable for the respective type model according to currently available economic data and technical data that is related to a respective adjusted variable and adding at least one of one or more economic variables and one or more technical variables to the respective type model according to the currently available economic data and technical data that is related to a respective added variable; iv) refining each updated type model by adjusting each technical variable and each economic variable for the respective updated type model according to a technical feasibility analysis for the respective potential conceptual engineering design scenario that is related to a respective adjusted variable; v) identifying one or more potential conceptual engineering design scenarios that are technically feasible and economical according to the respective technical feasibility analysis and a respective ranked net present value, wherein each identified potential conceptual engineering design scenario represents a technically feasible, economical scenario; vi) re-updating each refined type model associated with a respective technically feasible, economical scenario by at least one of adjusting each technical variable and each economic variable for the respective refined type model according to any additional economic data and technical data that is related to a respective adjusted variable and adding at least one of one or more economic variables and one or more technical variables to the respective refined type model according to any additional economic data and technical data that is related to a respective added variable; vii) updating each ranked net present value for the respective technically feasible, economical scenario; and viii) selecting a best profitable engineering design scenario from the technically feasible, economical scenarios based on at least one of the respective updated net present value and a respective acceptable project bid from a contractor that includes a project timeline estimate for developing components required to produce at least one of oil and gas from the potential asset target.

In yet another embodiment, the present disclosure includes a non-transitory program carrier device tangibly carrying computer executable instructions for selecting an engineering design scenario for a potential asset target by total asset modeling, the instructions being executable to implement: i) associating a unique type model with each potential conceptual engineering design scenario wherein, wherein each type model includes one or more economic variables and one or more technical variables; ii) updating each type model by at least one of adjusting each technical variable and each economic variable for the respective type model according to currently available economic data and technical data that is related to a respective adjusted variable and adding at least one of one or more economic variables and one or more technical variables to the respective type model according to the currently available economic data and technical data that is related to a respective added variable; iii) refining each updated type model by adjusting each technical variable and each economic variable for the respective updated type model according to a technical feasibility analysis for the respective potential conceptual engineering design scenario that is related to a respective adjusted variable; iv) identifying one or more potential conceptual engineering design scenarios that are technically feasible and economical according to the respective technical feasibility analysis and a respective ranked net present value, wherein each identified potential conceptual engineering design scenario represents a technically feasible, economical scenario; v) re-updating each refined type model associated with a respective technically feasible, economical scenario by at least one of adjusting each technical variable and each economic variable for the respective refined type model according to any additional economic data and technical data that is related to a respective adjusted variable and adding at least one of one or more economic variables and one or more technical variables to the respective refined type model according to any additional economic data and technical data that is related to a respective added variable; vi) re-refining each re-updated type model by adjusting each technical variable for the respective re-updated type model according to a front end engineering design study for the respective technically feasible, economical scenario that is related to a respective adjusted variable; vii) updating each ranked net present value for the respective technically feasible, economical scenario using the respective re-refined type model; and viii) selecting a best profitable engineering design scenario from the technically feasible, economical scenarios based on at least one of the respective updated net present value and a respective acceptable project bid from a contractor that includes a project timeline estimate for developing components required to produce at least one of oil and gas from the potential asset target.

The subject matter of the present disclosure is described with specificity, however, the description itself is not intended to limit the scope of the disclosure. The subject matter thus, might also be embodied in other ways, to include different steps or combinations of steps similar to the ones described herein, in conjunction with other present or future technologies. Moreover, although the term "step" may be used herein to describe different elements of methods employed, the term should not be interpreted as implying any particular order among or between various steps herein disclosed unless otherwise expressly limited by the description to a particular order. While the present disclosure may be applied in the oil and gas industry, it is not limited thereto and may also be applied in other industries to achieve similar results.

Method Description

Because major decisions regarding the identification of a new target asset at any stage, but particularly at the early stages, are primarily financial in nature rather than technical, a total asset model must include economic information. Likewise, optimization of field logistics, capture of organizational learning and knowledge transfer coupled with geological and geophysical models are additional aspects of a total asset model. Referring now to FIG. 1, a flow diagram of one embodiment of a method 100 for implementing the present disclosure is illustrated. The method 100 enables the identification and evaluation of a potential asset target through total asset modeling.

In step 101, a potential asset target is identified using techniques well known in the art. The potential asset target preferably contains oil and/or gas deposits and may be a previously undiscovered asset, an asset under active exploration or development, a producing asset, or even a previously-abandoned asset. Assets that exist at early (e.g. acquisition) lifecycle stages must be studied in terms of the large-scale engineering concepts that can be used to develop them. For instance, an offshore asset might be produced through a variety of different platform designs, with compression facilities either on the platform or onshore, or using a Floating Production, Storage, and Offloading (FPSO) vessel. An onshore asset may include various stages of gas processing or fractionation, require the use of hydraulic fracturing with its associated infrastructure needs, or be designed for gas or water injection.

In step 102, an initial list of potential conceptual engineering design scenarios for the potential asset target are evaluated to reduce the potential design scenarios in the list and decide whether to select a single design scenario.

In step 104, a single design scenario, which represents the potential asset target, is selected from the initial list of potential conceptual engineering design scenarios and is evaluated to determine whether to proceed to project execution for the potential asset target.

In step 106, a project is executed for the potential asset target that includes procuring capital equipment and constructing facilities for the project and the potential asset target is evaluated based on the executed project to determine whether to begin production operations.

In step 108, production operations are performed for the potential asset target and the potential asset target is evaluated based on the production operations to determine whether to maintain production operations.

Figure 2:
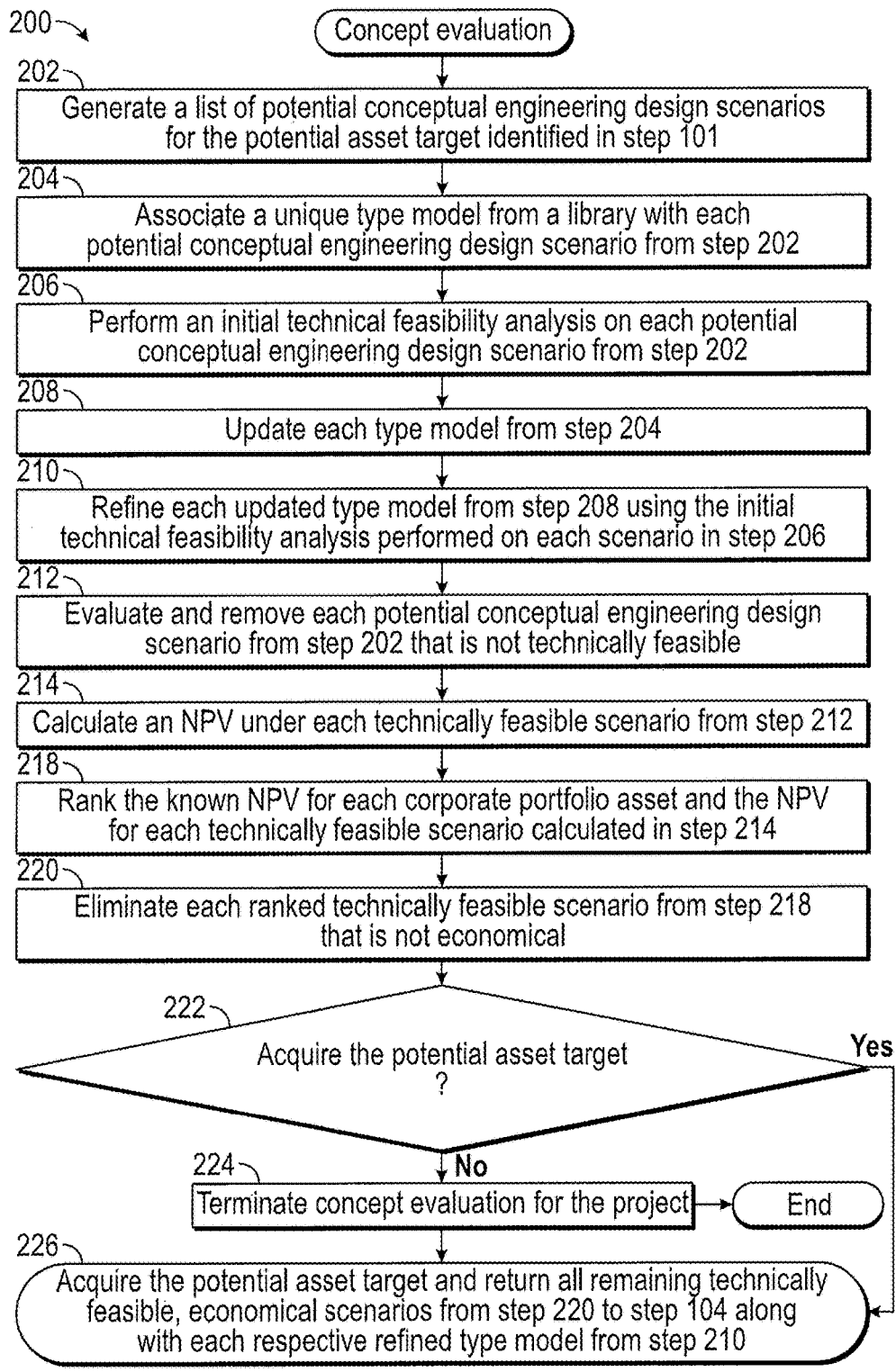
FIG. 2 is a flow diagram illustrating one embodiment of a method for performing step 102 in FIG. 1.

Referring now to FIG. 2, a flow diagram illustrating one embodiment of a method 200 for performing step 102 in FIG. 1 is illustrated. An initial list of potential conceptual engineering design scenarios for the potential asset target are evaluated to reduce the potential design scenarios in the list and decide whether to select a single design scenario.

Figure 8:
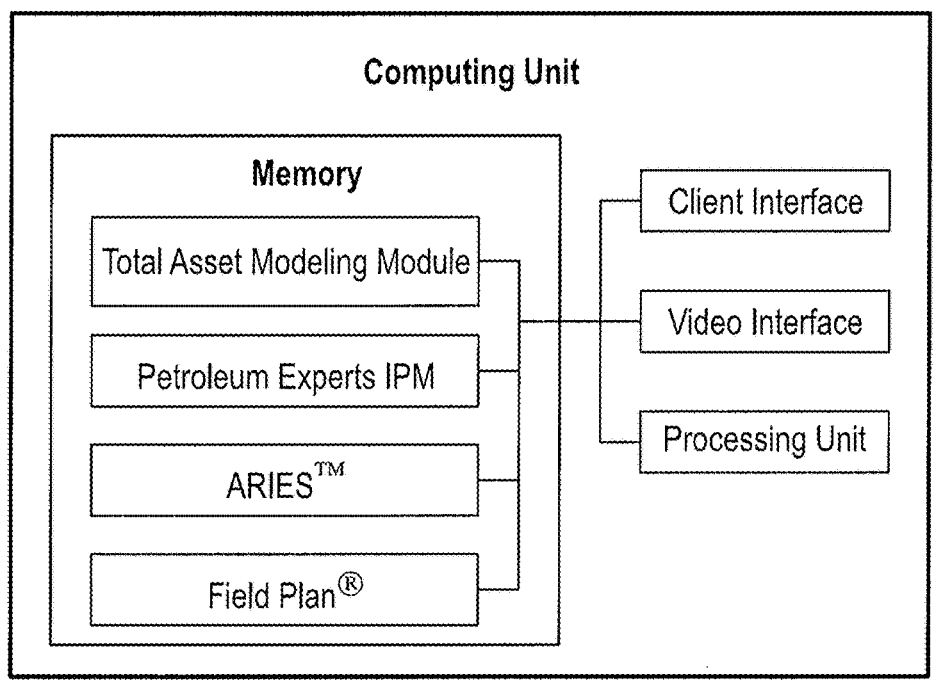
FIG. 8 is a block diagram illustrating one embodiment of a computer system for implementing the present disclosure.

In step 202, a list of potential conceptual engineering design scenarios is manually generated for the potential asset target identified in step 101, using the client interface and/or the video interface described further in reference to FIG. 8, based on the historical experience of the operating company and the judgment of individual engineers and executives. Decisions about large-scale conceptual engineering designs made at this stage of an asset lifecycle can save (or cost) billions of dollars in Net Present Value (NPV). In general, the largest opportunities for increasing asset profitability occur at the earliest stages of the asset's life. As decisions are made, and large capital projects undertaken, technical and financial options become increasingly constrained.

In step 204, a unique type model from a library is associated with each potential conceptual engineering design scenario from step 202. The library includes templates that can be used to evaluate common conceptual engineering designs. Each template includes an IAM, which provides a consolidated technical description of the reservoir, wellbores, and surface production facilities associated with the potential asset target. Each template also includes baseline financial and economic data associated with the potential asset target and facilities, as well as estimates for the uncertainties associated with all variables to which the project's ultimate objective (typically either NPV or total produced hydrocarbons) are sensitive. Because the templates allow performance of a new potential asset target to be readily estimated using the "typical" performance of similar existing assets—much as production type curves do for individual oil and gas wells—the templates are called type models. One type model is included in the library for each asset/scenario pair. By using type models, unfeasible or uneconomic designs can be eliminated quickly and reliably at the earliest stages of evaluation.

In step 206, an initial technical feasibility analysis is performed on each potential conceptual engineering design scenario from step 202, using the client interface and/or the video interface described further in reference to FIG. 8, by adjusting sensitive variables in the type model associated with each respective scenario using techniques well known in the art and any historical data, corporate best practices, assumptions or engineering rules of thumb.

In step 208, each type model from step 204 is automatically updated with all of the latest (most current) exploration, laboratory (e.g. core or fluid sample), simulation results, oil price forecast and macroeconomic data related to each respective type model or may be manually updated using the client interface and/or the video interface described further in reference to FIG. 8. The data is used as input for variables in each type model that have a measurable impact on the performance of the type model.

In step 210, each updated type model from step 208 is refined using the initial technical feasibility analysis performed on each scenario in step 206 by tuning the performance of each updated type model and performing a sensitivity analysis on each updated type model. Performance tuning may involve further adjustments to sensitive variables in each updated type model. Performance tuning can be performed automatically or manually using the client interface and/or the video interface described further in reference to FIG. 8, which can be assisted by expert systems, which are pre-programmed to include known relationships among variables and best practice decision support. Once tuned, a sensitivity analysis can be performed on each updated type model manually using the client interface and/or the video interface described further in reference to FIG. 8 or by using automation (e.g. scripting) technologies to illustrate the feasible ranges of variable combinations and the associated global performance of each updated type model under all feasible conditions.

In step 212, each potential conceptual engineering design scenario from step 202 is evaluated and removed if it is not technically feasible after an updated technical feasibility analysis is performed on each scenario by adjusting sensitive variables in the refined type model from step 210 associated with each respective scenario using techniques well known in the art and any historical data, corporate best practices, assumptions or engineering rules of thumb.

In step 214, an NPV is calculated under each technically feasible scenario from step 212 for the potential asset target using techniques well known in the art and the most current oil/gas pricing and macroeconomic data, forecasts of hydrocarbon production and operating costs.

In step 218, the known NPV for each corporate portfolio asset and the NPV for each technically feasible scenario calculated in step 214 are ranked (low to high or high to low). The ranked NPV's are sent to the list of project stakeholders who have requested updates.

In step 220, each ranked technically feasible scenario from step 218 that is not economical is eliminated from further consideration. This enables the evaluation of different scenarios that are expected to maximize the overall profitability of a corporate portfolio over a given time horizon. In this context, technically feasible scenarios for a potential asset target may not be economical, even though they have a positive NPV, because some may not outrank the NPV of other corporate portfolio assets or some may conflict in terms of timing or overall capital spend with alternatives scheduled for a given year. The purpose of this step, then, is to ensure that decisions made for the potential asset target currently under consideration are consistent with plans being made at a higher corporate level based on other corporate portfolio assets.

In step 222, the method 200 determines whether to acquire the potential asset target based on the remaining technically feasible, economical scenarios from step 220. A decision at this stage of the method 100 does not finalize the conceptual engineering design for the potential asset target, but rather expresses confidence (or skepticism) that a suitable design envelope exists within which to execute a profitable project that meets corporate investment criteria. If the decision is not to acquire the potential asset target, then the method 200 proceeds to step 224. If the decision is to acquire the potential asset target, then the method 200 proceeds to step 226.

In step 224, concept evaluation for the project is terminated and the method 200 ends. Rights to explore and/or develop the potential asset target can be sold or the project can be reconsidered at a later date.

In step 226, the potential asset target is acquired and all remaining technically feasible, economical scenarios from step 220 are returned to step 104 along with each respective refined type model from step 210. Through the transfer of the refined type model for each respective technically feasible, economical scenario, the method 100 i) captures the expressed intent of earlier stakeholders in a later decision making context; ii) eliminates duplication of efforts; iii) reduces human error in transcription of data; and iv) allows the corporation to audit changes in modeling assumptions made at every stage of the potential asset target's life and to understand the financial impact of those changes immediately since the NPV of each technically feasible scenario can be automatically updated after every variable change.

Figure 3:
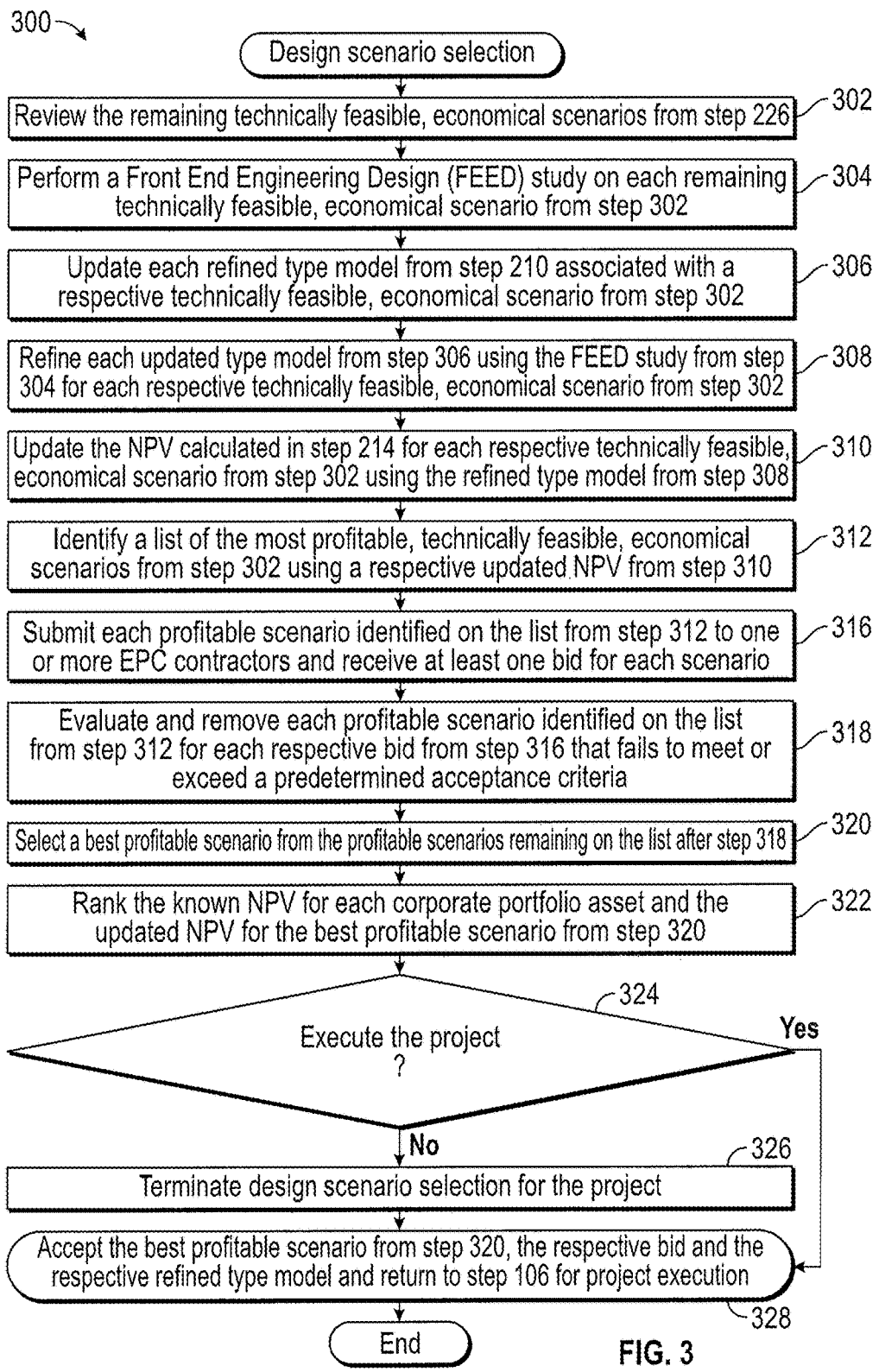
FIG. 3 is a flow diagram illustrating one embodiment of a method for performing step 104 in FIG. 1.

Referring now to FIG. 3, a flow diagram illustrating one embodiment of a method 300 for performing step 104 in FIG. 1 is illustrated. Once the potential asset target is acquired in step 226, a single design scenario is selected from the remaining technically feasible, economical scenarios and is evaluated to determine whether to proceed to project execution for the potential asset target. This represents a key milestone in the development of the potential asset target and is perhaps the best opportunity to maximize the overall value of the potential asset target.

In step 302, the remaining technically feasible, economical scenarios from step 226 are reviewed using the client interface and/or the video interface described further in reference to FIG. 8 and techniques well known in the art to confirm all major assumptions therein and to make any necessary modifications based on changes in the operational or financial environment that have taken place since the potential asset target was acquired.

In step 304, a Front End Engineering Design (FEED) study is performed on each remaining technically feasible, economical scenario from step 302 using techniques well known in the art and the client interface and/or the video interface described further in reference to FIG. 8. The objective of this step is to clearly articulate the technical requirements for constructing each technically feasible, economical scenario and to estimate its total investment cost. The FEED studies may be used by Engineering, Procurement & Construction (EPC) contractors as the basis for bidding on the projects.

In step 306, each refined type model from step 210, associated with a respective technically feasible, economical scenario from step 302, is automatically updated with all of the latest (most current) exploration, laboratory (e.g. core or fluid sample), simulation results, oil price forecast and macroeconomic data related to each respective type model or may be manually updated using the client interface and/or the video interface described further in reference to FIG. 8. The data is used as input for variables in each type model that have a measurable impact on the performance of the type model. It is important to realize that frequent updates to the type models serve not only to inform current decision making exercises, but also can cast new light on prior decisions or alert previous decision makers to large deviations in expected technical or financial performance for the potential asset target. In this manner, all stakeholders—even those who are no longer currently engaged on work for the potential asset target—are provided a nearly instantaneous view of asset-level changes being driven by later decisions. This view is both an audit trail (for corporate continuous learning purposes) and a means for taking corrective action at the corporate portfolio level to ensure future profitability.

In step 308, each updated type model from step 306 is automatically refined or may be manually refined in the same manner as step 210 using the client interface and/or the video interface described further in reference to FIG. 8 and the FEED study from step 304 for each respective technically feasible, economical scenario from step 302.

In step 310, the NPV calculated in step 214 for each respective technically feasible, economical scenario from step 302 is updated using the refined type model from step 308 for each respective technically feasible, economical scenario from step 302. If the updated NPV for a respective technically feasible, economical scenario from step 302 has changed beyond a threshold value, then send notifications to the list of project stakeholders who have requested updates.

In step 312, a list of the most profitable, technically feasible, economical scenarios from step 302 are identified using a respective updated NPV from step 310 and techniques well known in the art. The list will be used by EPC contractors as the basis for bidding on the projects.

In step 316, each profitable scenario identified on the list from step 312 is submitted to one or more EPC contractors and at least one bid is received for each scenario. Each bid should include technical, cost, and project timeline estimates.

In step 318, each profitable scenario identified on the list from step 312 is evaluated and removed from the list using the client interface and/or the video interface described further in reference to FIG. 8 if none of the respective bids from step 316 meet or exceed a predetermined acceptance criteria based on technical, cost, and project timeline requirements and/or goals. The objective of this step is to identify scenarios that, while potentially profitable, may fall outside the desired project completion window based on bids returned by the potential EPC contractors. A mismatch between timelines and expected cash flows may disqualify an otherwise attractive conceptual engineering design.

In step 320, a best profitable scenario is selected from the profitable scenarios remaining on the list after step 318, using the client interface and/or the video interface described further in reference to FIG. 8, based on the scenario and the respective bid that maximizes the overall project requirements, goals and/or constraints. The scenario will typically include, for consideration, NPV, but could also include total hydrocarbon production or some other measure while the respective bid includes, for consideration, the technical, cost and project timeline estimates.

In step 322, the known NPV for each corporate portfolio asset and the updated NPV for the best profitable scenario from step 320 are ranked (low to high or high to low). The ranked NPV's are sent to the list of project stakeholders who have requested updates.

In step 324, the method 300 determines whether to execute the project based on a comparison of the ranking in step 322 and the corporate portfolio capital spending budget. The project will be executed if the NPV rank for the best profitable scenario from step 320 falls above a line based on the capital spending budget. As an example, imagine that the best profitable scenario is ranked fifth and costs $20 million. Further imagine that the capital spending budget is $100 million. The four highest ranking corporate portfolio assets cost $10, $30, $15, and $40 million, leaving only $5 million. If the decision is to execute the project, then the method 300 proceeds to step 328. If the decision is not to execute the project, then the method 300 proceeds to step 326.

In step 326, design scenario selection for the project is terminated and the method 300 ends. Rights to explore and/or develop the potential asset target can be sold or the project can be reconsidered at a later date with or without additional investment partners to help allay expenses and share the risk.

In step 328, the best profitable scenario from step 320, the respective bid and the respective refined type model are accepted and returned to step 106 for project execution.

Figure 4:
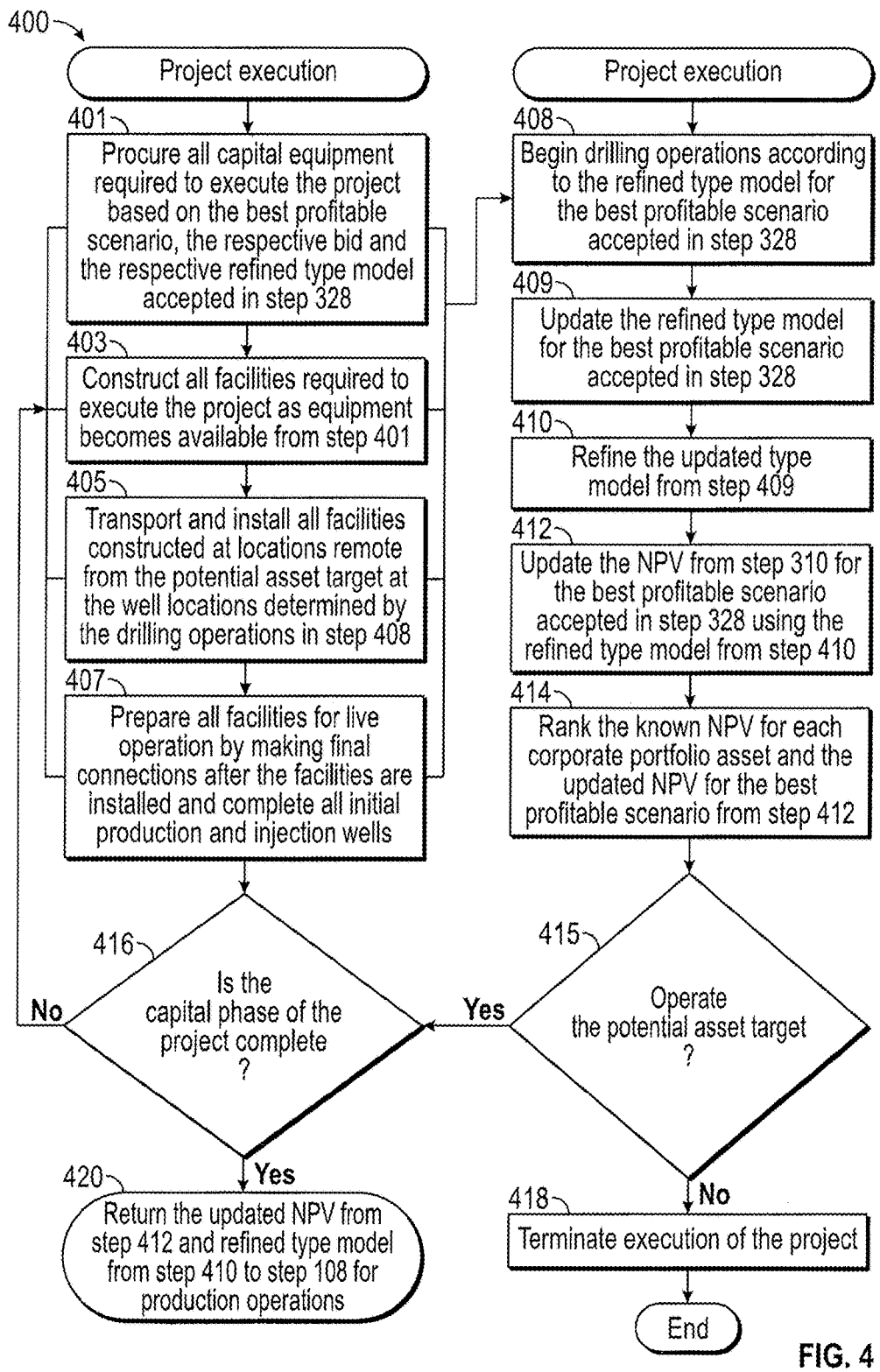
FIG. 4 is a flow diagram illustrating one embodiment of a method for performing step 106 in FIG. 1.

Referring now to FIG. 4, a flow diagram illustrating one embodiment of a method 400 for performing step 106 in FIG. 1 is illustrated. A project is executed for the potential asset target that includes two parallel activity tracks: the capital engineering project (executed by the EPC contractor) to procure the capital equipment and build the facilities required for oil and gas production and transport (e.g. platforms, compression trains, pipelines), and the field development project (executed by oilfield service companies) to plan and drill wells and prepare for the production and sale of hydrocarbons. The potential asset target is evaluated based on the executed project to determine whether to begin production operations. In other words, data from both activities is used to continuously update the type model because performance on both tracks directly influences NPV.

In step 401, all capital equipment required to execute the project (e.g. that will support drilling, production, storage, and transport) are procured based on the best profitable scenario, the respective bid and the respective refined type model accepted in step 328. Lead times for many of these items can be two years or more. This step may be performed in parallel with steps 408-416 and may pass related information to step 409, during each iteration of step 409, if such information has not already passed on to step 409.

In step 403, all facilities required to execute the project are constructed as equipment becomes available from step 401. As well patterns are completed by the drilling operations in step 408, wells will be connected to constructed gathering systems. This step may be performed in parallel with steps 408-416 and may pass related information to step 409, during each iteration of step 409, if such information has not already passed on to step 409.

In step 405, all facilities constructed at locations remote from the potential asset target (e.g. floating production vessels) are transported and installed at the well locations determined by the drilling operations in step 408. Pipelines must be connected to onshore terminals and perhaps to subsea gathering or compression systems. Any change to the facilities due to this step must be reflected in the refined type model for the best profitable scenario accepted in step 328. This step may be performed in parallel with steps 408-416 and may pass related information to step 409, during each iteration of step 409, if such information has not already passed on to step 409.

In step 407, all facilities are prepared ("commissioned") for live operation by making final connections ("hook up") after the facilities are installed and all initial production and injection wells are completed by the drilling operations in step 408. This step may be performed in parallel with steps 408-416 and may pass related information to step 409, during each iteration of step 409, if such information has not already passed on to step 409.

In step 408, drilling operations begin according to the refined type model for the best profitable scenario accepted in step 328. Drilling is time intensive, particularly in deepwater offshore or arctic environments, and the number of available drilling rigs may be limited. The drilling operations anticipate having an expected number of wells ready to produce at the point the facilities are commissioned in step 407. Additionally, information from steps 403, 405 and 407, such as changes to the trajectory of pipelines or the sizing of pumps, may affect the well locations, the well patterns and the initial production/injection wells determined and completed by the drilling operations because the drilling operations for this step may persist through each step of the method 400.

In step 409, the refined type model for the best profitable scenario accepted in step 328 is automatically updated with i) all of the latest (most current) development, laboratory (e.g. core or fluid sample), simulation results, oil price forecast and macroeconomic data related to the refined type model accepted in step 328; ii) the drilling operations data (e.g. actual reservoir data from flowing wells) from step 408; and iii) information from the current capital phase of the project represented by steps 401, 403, 405 and/or 407, or may be manually updated using the client interface and/or the video interface described further in reference to FIG. 8.

The data is used as input for variables in the refined type model that have a measurable impact on the performance of the refined type model.

In step 410, the updated type model from step 409 is automatically refined or may be manually refined in the same manner as step 210 using the client interface and/or the video interface described further in reference to FIG. 8, any additional changes as a result of steps 405 and 407, and the drilling operations data (e.g. actual reservoir data from flowing wells) from step 408.

In step 412, the NPV from step 310 for the best profitable scenario accepted in step 328 is updated using the refined type model from step 410. If the updated NPV for the best profitable scenario accepted in step 328 has changed beyond a threshold value, then send notifications to the list of project stakeholders who have requested updates.

In step 414, the known NPV for each corporate portfolio asset and the updated NPV for the best profitable scenario from step 412 are ranked (low to high or high to low). The ranked NPV's are sent to the list of project stakeholders who have requested updates.

In step 415, the method 400 determines whether to operate the asset based on a comparison of the ranking in step 414 and the corporate portfolio capital spending budget. The project will be executed if the NPV rank for the best profitable scenario from step 412 falls above a line based on the capital spending budget. As an example, imagine that the best profitable scenario is ranked fifth and costs $20 million. Further imagine that the capital spending budget is $100 million. The four highest ranking corporate portfolio assets cost $10, $30, $15, and $40 million, leaving only $5 million. If the decision is to operate the asset, then the method 400 proceeds to step 416. If the decision is not to execute the project, then the method 400 proceeds to step 418.

In step 416, the method 400 determines whether the capital phase of the project is complete based on whether step 407 is complete. If the capital phase of the project is not complete, then the method 400 returns to the current step in the capital phase of the project for current information, which is then passed on to the next iteration of step 409. If the capital phase of the project is complete, then the method 400 proceeds to step 420.

In step 418, execution of the project is terminated and the method 400 ends. The entire potential asset target can be sold or a controlling interest can be sold to a partner or independent contractor that takes over production operations for the project.

In step 420, the updated NPV from step 412 and refined type model from step 410 are returned to step 108 for production operations, and operating control of the commissioned facilities in step 407 is taken over from the EPC contractor.

Figure 5:
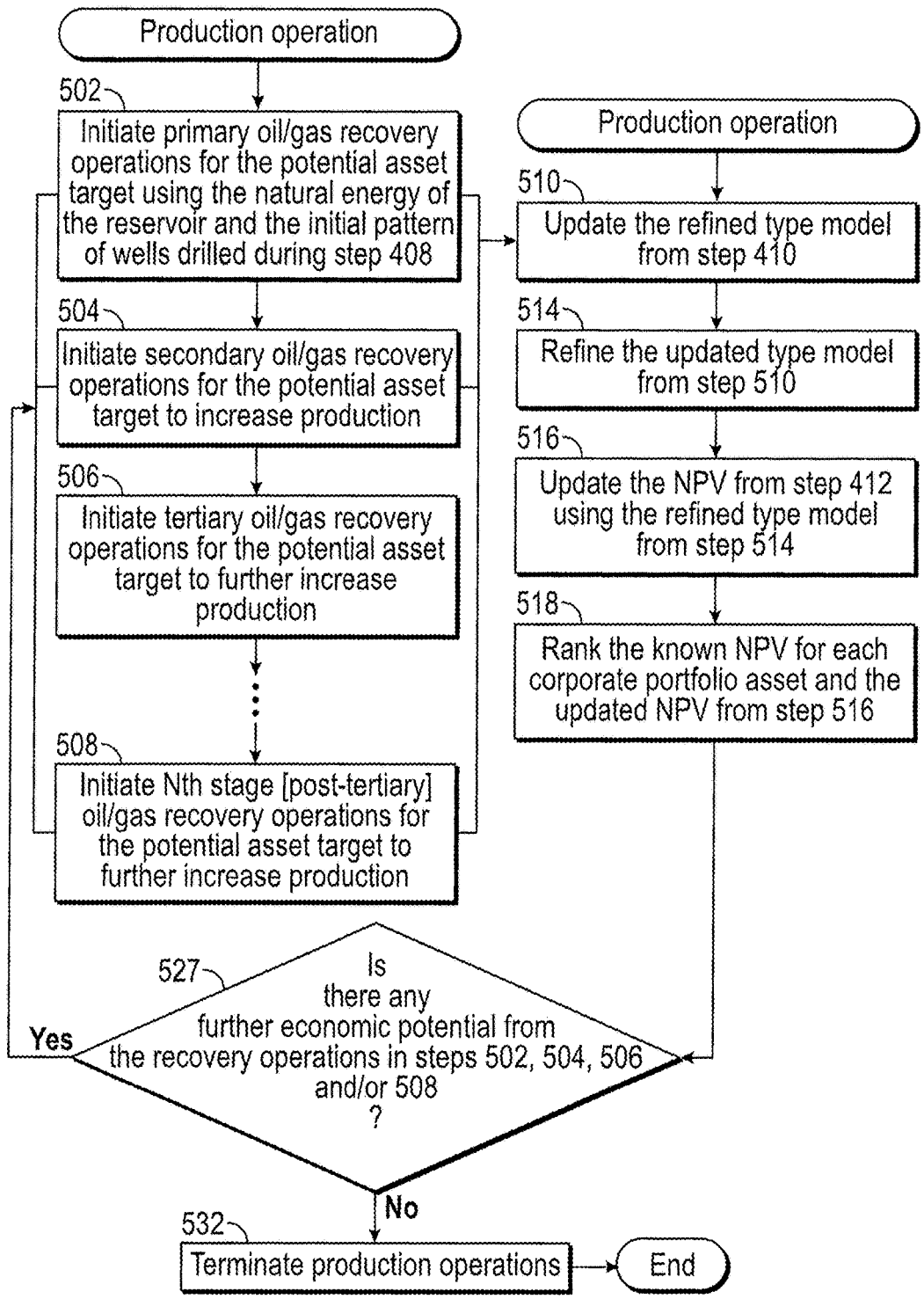
FIG. 5 is a flow diagram illustrating one embodiment of a method for performing step 108 in FIG. 1.
Figure 6:
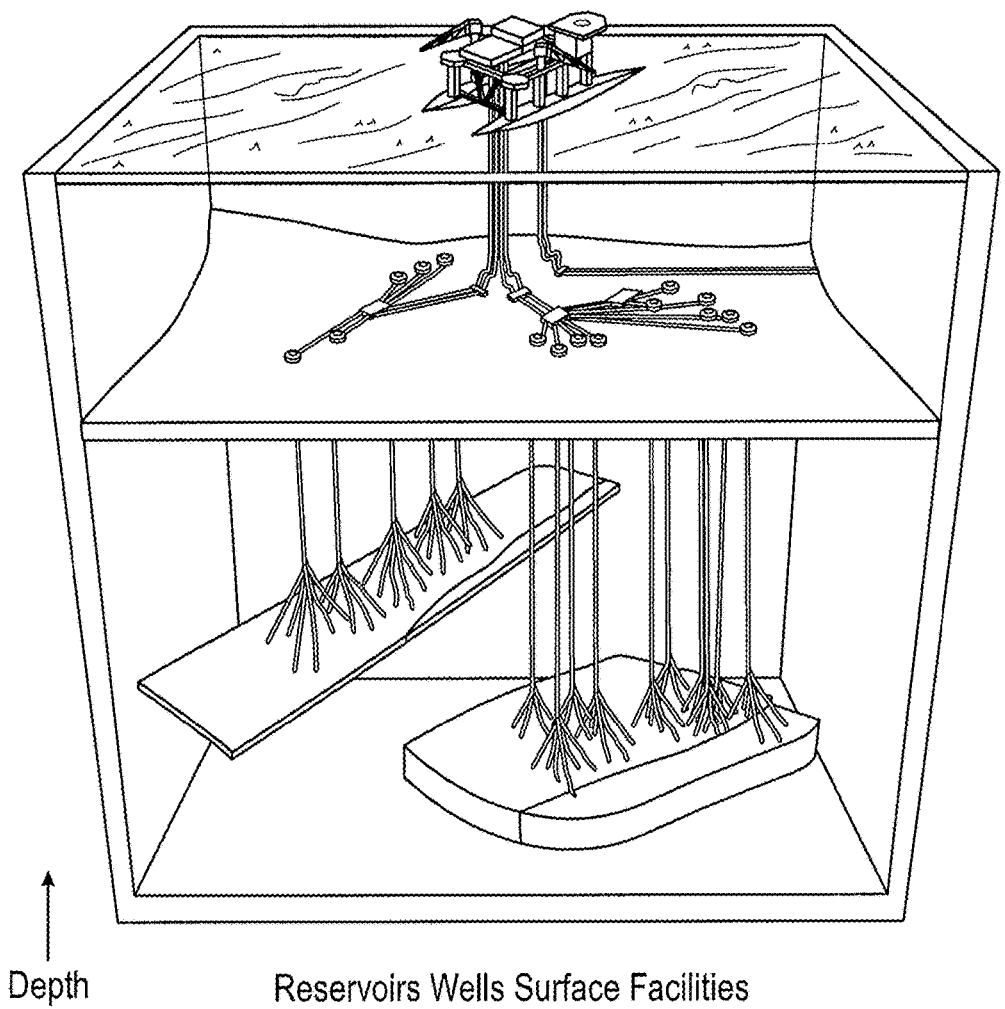
FIG. 6 is a schematic display illustrating a conventional integrated-asset-model.
Figure 7:
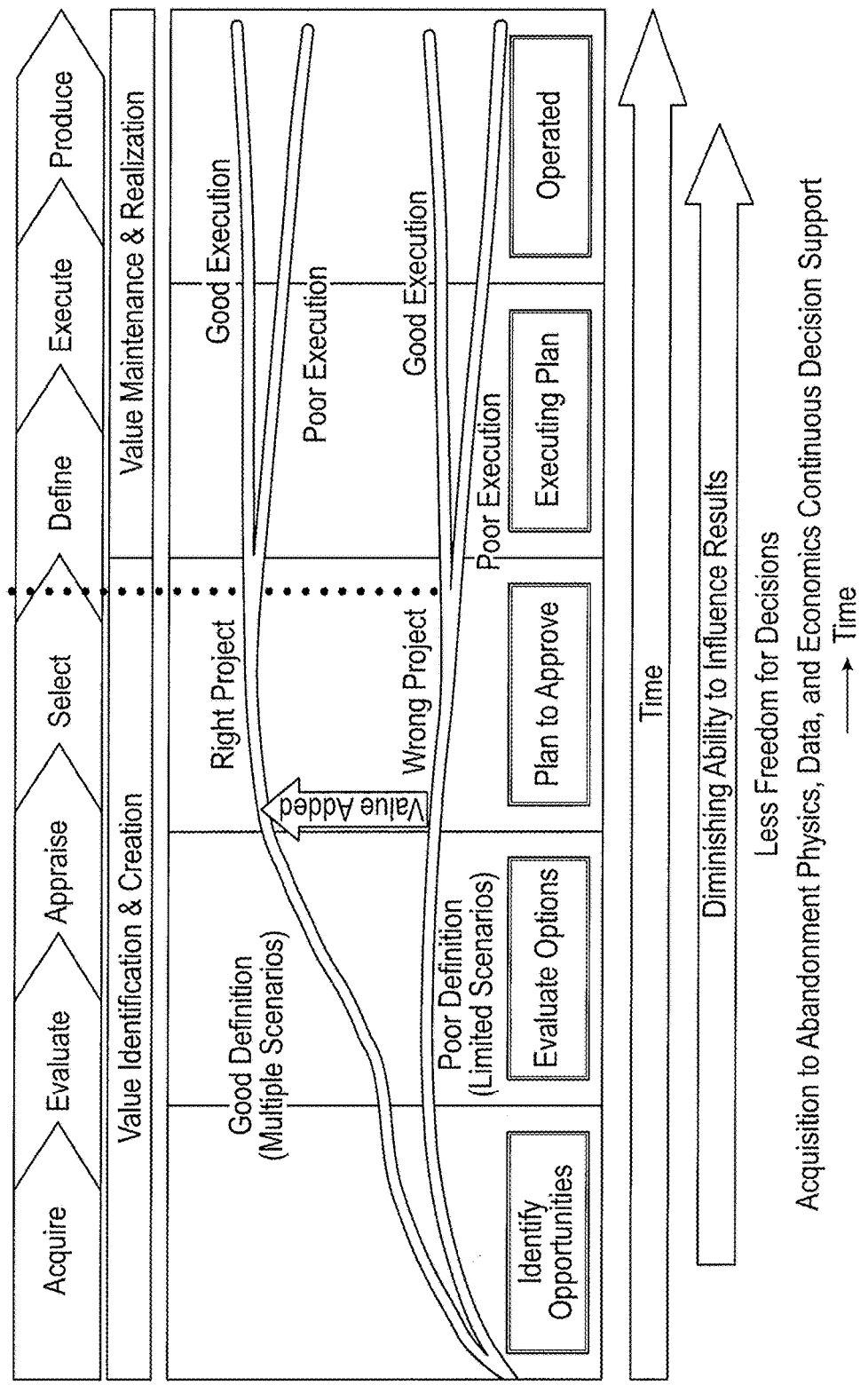
FIG. 7 is a schematic display illustrating a conventional persistent-asset-model.

Referring now to FIG. 5, a flow diagram illustrating one embodiment of a method 500 for performing step 108 in FIG. 1 is illustrated. Production operations are performed for the potential asset target and the potential asset target is evaluated based on the production operations to determine whether to maintain production operations. Production operations includes recovery operations and entails working on the field development plan described by the type model, making day-to-day and week-to-week adjustments as necessary to respond to unforeseen events such as equipment failures or deviations between projected and actual reservoir behavior, and devising strategies for maximizing long-term production as the asset matures.

In step 502, primary oil/gas recovery operations are initiated for the potential asset target using the natural energy of the reservoir and the initial pattern of wells drilled during step 408. This step may be performed in parallel with steps 510-527 and may pass related information to step 510, during each iteration of step 510, if such information has not already passed on to step 510.

In step 504, secondary oil/gas recovery operations are initiated for the potential asset target to increase production (e.g. further infill drilling, additional injection). This step may be performed in parallel with steps 510-527 and may pass related information to step 510, during each iteration of step 510, if such information has not already passed on to step 510.

In step 506, tertiary oil/gas recovery operations are initiated for the potential asset target to further increase production. Tertiary recovery operations will be technologically complex and expensive. The economic justification for them will become increasingly challenging as the potential asset target matures. This step may be performed in parallel with steps 510-527 and may pass related information to step 510, during each iteration of step 510, if such information has not already passed on to step 510.

In step 508, oil/gas recovery operations are initiated for the potential asset target to further increase production. Post-tertiary recovery operations will also be technologically complex and expensive. The economic justification for them will also become increasingly challenging as the potential asset target matures. This step may be performed in parallel with steps 510-527 and may pass related information to step 510, during each iteration of step 510, if such information has not already passed on to step 510.

In step 510, the refined type model from step 410 is automatically updated with i) all of the latest (most current) development, laboratory (e.g. core or fluid sample), simulation results, oil price forecast and macroeconomic data related to the refined type model from step 410; ii) production data from the recovery operations in steps 502, 504, 506 and/or 508; iii) well test data from the recovery operations in steps 502, 504, 506 and/or 508; and iv) production forecast data from the recovery operations in steps 502, 504, 506 and/or 508, or may be manually updated using the client interface and/or the video interface described further in reference to FIG. 8. The data is used as input for variables in the refined type model that have a measurable impact on the performance of the refined type model.

In step 514, the updated type model from step 510 is automatically refined or may be manually refined in the same manner as step 210 using the client interface and/or the video interface described further in reference to FIG. 8 and i) all of the latest (most current) simulation results, oil price forecast and macroeconomic data related to the refined type model from step 410; ii) production data from the recovery operations in steps 502, 504, 506, and/or 508; iii) well test data from the recovery operations in steps 502, 504, 506 and/or 508; and iv) production forecast data from the recovery operations in steps 502, 504, 506 and/or 508.

In step 516, the NPV from step 412 is updated using the refined type model from step 514. If the updated NPV has changed beyond a threshold value, then send notifications to the list of project stakeholders who have requested updates.

In step 518, the known NPV for each corporate portfolio asset and the updated NPV from step 516 are ranked (low to high or high to low). The ranked NPV's are sent to the list of project stakeholders who have requested updates.

In step 527, the method 500 determines whether there is any further economic potential from the recovery operations in steps 502, 504, 506 and/or 508 based on the rank of the updated NPV from step 518. If there is further economic potential from the recovery operations in steps 502, 504, 506 and/or 508, then the method 500 returns to the current step of the recovery operations for current information, which is then passed on to the next iteration of step 510. If there is no further economic potential from the recovery operations in steps 502, 504, 506 and/or 508, then the method 500 proceeds to step 532.

In step 532, production operations for the project are terminated and the method 500 ends. Rights to the potential asset target can be sold or the project can be abandoned.

The method 100 represents a total asset model that effectively couples the IAM and the PAM so that the IAM is maintained over the lifecycle of the potential asset target. In this manner, the following factors contributing to lost production value in most conventional models are addressed and mitigated: i) the asset's full potential may be initially compromised during field development planning and during the design process; ii) the asset may be further compromised during construction resulting in a sub-optimal installed potential; iii) at completion and commissioning and thereafter, key production wells, equipment and facilities may experience performance degradation; iv) due to inevitable down time or sub-optimal maintenance planning, the production facilities actually available at a given period are often sub-optimal; v) throughout the daily, real time production cycle, equipment set points and operating parameters are frequently not consistent with the optimal value production profile; vi) unforeseen behaviors and events result in loss of production over and above the accepted operating envelope that informs production targets; and vii) historically increasing production without due regard to reservoir constraints has been at the expense of ultimate recovery and potentially to the detriment of the ultimate NPV of the asset.

The total asset model represented by the method 100 is initiated earlier in the asset lifecycle and is maintained over the entire asset lifecycle, which may be used to support: i) dynamic portfolio management, whereupon portfolio decisions are validated or iterated at the point in the project where sufficient data becomes available to do so; ii) dynamic asset planning based upon when project data becomes available, thus supporting the earliest possible optimal decision outcome and project change control; and iii) dynamic production system management, in order to operate at the asset's inherent potential.

The total asset model therefore, will: i) extend the uncertainty estimation/reduction framework to multiple time scales (lifecycle stages), well models, and production facility networks; ii) create formalized object models, data structures, and communication protocols designed to bridge the gaps among separate teams operating at different asset lifecycle stages, which will enable later stage teams to confidently use results generated earlier in the asset lifecycle and allow earlier assumptions to be validated/updated with results generated later in the asset lifecycle; iii) extend the time-space data transform function concept for geological models and for integrated asset models to fully span the geological, geophysical, production, and economic spaces; and iv) continuously optimize the asset with respect to selected physical or financial objectives at every lifecycle stage, and re-optimize early stage variables or decisions wherever possible using the latest results from later stages.

System Description

The present disclosure may be implemented through a computer-executable program of instructions, such as program modules, generally referred to as software applications or application programs executed by a computer. The software may include, for example, routines, programs, objects, components and data structures that perform particular tasks or implement particular abstract data types. The software forms an interface to allow a computer to react according to a source of input. FieldPlan®, which is a commercial software application marketed by Landmark Graphics Corporation, may be used as an interface application to implement the present disclosure. The software may also cooperate with other code segments to initiate a variety of tasks in response to data received in conjunction with the source of the received data. The software may be stored and/or carried on any variety of memory such as CD-ROM, magnetic disk, bubble memory and semiconductor memory (e.g. various types of RAM or ROM). Furthermore, the software and its results may be transmitted over a variety of carrier media such as optical fiber, metallic wire and/or through any of a variety of networks, such as the Internet.

Moreover, those skilled in the art will appreciate that the disclosure may be practiced with a variety of computer-system configurations, including hand-held devices, multiprocessor systems, microprocessor-based or programmable-consumer electronics, minicomputers, mainframe computers, and the like. Any number of computer-systems and computer networks are acceptable for use with the present disclosure. The disclosure may be practiced in distributed-computing environments where tasks are performed by remote-processing devices that are linked through a communications network. In a distributed-computing environment, program modules may be located in both local and remote computer-storage media including memory storage devices. The present disclosure may therefore, be implemented in connection with various hardware, software or a combination thereof, in a computer system or other processing system.

Referring now to FIG. 8, a block diagram illustrates one embodiment of a system for implementing the present disclosure on a computer. The system includes a computing unit, sometimes referred to as a computing system, which contains memory, application programs, a client interface, a video interface, and a processing unit. The computing unit is only one example of a suitable computing environment and is not intended to suggest any limitation as to the scope of use or functionality of the disclosure.

The memory primarily stores the application programs, which may also be described as program modules containing computer-executable instructions, executed by the computing unit for implementing the present disclosure described herein and illustrated in FIGS. 1-5. The memory therefore, includes a total asset modeling module, which enables the methods described in reference to FIGS. 1-5. The total asset modeling module may integrate functionality from the remaining application programs illustrated in FIG. 8. In particular, FieldPlan® may be used as an interface application to serve as a central hub for interacting with all of the components of the integrated and persistent asset models, visualizing conceptual designs such as platform and pipeline layouts, producing technical and economic reports, and loading or exporting data from/to external systems, which includes steps 202, 204, 218, 220, 302, 304, 322, 418 and 516 in FIGS. 2-5. Although FieldPlan® may be used as an interface application, other interface applications may be used, instead, or the total asset modeling module may be used as a stand-alone application In addition, integrated asset models, being combinations of reservoir, well, surface facility, and economics sub-models, may be built using the Petroleum Experts IPM suite (for the engineering functionality) and Landmark ARIES™ (for the economics functionality). IPM and ARIES™ are used wherever analyses are performed or changes are made to the type model associated with any scenario, which includes steps 206, 208, 210, 214, 302, 306, 308, 310, 412, 414, 416, 510, 512 and 514 in FIGS. 2-5.

Although the computing unit is shown as having a generalized memory, the computing unit typically includes a variety of computer readable media. By way of example, and not limitation, computer readable media may comprise computer storage media and communication media. The computing system memory may include computer storage media in the form of volatile and/or nonvolatile memory such as a read only memory (ROM) and random access memory (RAM). A basic input/output system (BIOS), containing the basic routines that help to transfer information between elements within the computing unit, such as during start-up, is typically stored in ROM. The RAM typically contains data and/or program modules that are immediately accessible to, and/or presently being operated on, the processing unit. By way of example, and not limitation, the computing unit includes an operating system, application programs, other program modules, and program data.

The components shown in the memory may also be included in other removable/nonremovable, volatile/nonvolatile computer storage media or they may be implemented in the computing unit through an application program interface ("API") or cloud computing, which may reside on a separate computing unit connected through a computer system or network. For example only, a hard disk drive may read from or write to nonremovable, nonvolatile magnetic media, a magnetic disk drive may read from or write to a removable, nonvolatile magnetic disk, and an optical disk drive may read from or write to a removable, nonvolatile optical disk such as a CD ROM or other optical media. Other removable/nonremovable, volatile/nonvolatile computer storage media that can be used in the exemplary operating environment may include, but are not limited to, magnetic tape cassettes, flash memory cards, digital versatile disks, digital video tape, solid state RAM, solid state ROM, and the like. The drives and their associated computer storage media discussed above provide storage of computer readable instructions, data structures, program modules and other data for the computing unit.

A client may enter commands and information into the computing unit through the client interface, which may be input devices such as a keyboard and pointing device, commonly referred to as a mouse, trackball or touch pad. Input devices may include a microphone, joystick, satellite dish, scanner, or the like. These and other input devices are often connected to the processing unit through the client interface that is coupled to a system bus, but may be connected by other interface and bus structures, such as a parallel port or a universal serial bus (USB).

A monitor or other type of display device may be connected to the system bus via an interface, such as a video interface. A graphical user interface ("GUI") may also be used with the video interface to receive instructions from the client interface and transmit instructions to the processing unit. In addition to the monitor, computers may also include other peripheral output devices such as speakers and printer, which may be connected through an output peripheral interface.

Although many other internal components of the computing unit are not shown, those of ordinary skill in the art will appreciate that such components and their interconnection are well known.

While the present disclosure has been described in connection with presently preferred embodiments, it will be understood by those skilled in the art that it is not intended to limit the disclosure to those embodiments. It is therefore, contemplated that various alternative embodiments and modifications may be made to the disclosed embodiments without departing from the spirit and scope of the disclosure defined by the appended claims and equivalents thereof.

The invention claimed is:

1. A method for generating a total asset valuation for a potential oil and gas field asset target by total asset modeling, which method comprises:
   (a) selecting a potential oil and gas field target asset;
   (b) generating a list of potential conceptual engineering design scenarios for the potential asset target selected in step (a);
   (c) retrieving from a library a unique type model;
   (d) associating the retrieved unique type model with each potential conceptual engineering design scenario wherein each unique type model includes one or more economic variables and one or more technical variables;
   (e) performing an initial technical feasibility analysis on each potential conceptual engineering design scenario from step (d);
   (f) evaluating and removing each potential conceptual engineering design scenario from step (e) that is not technically feasible to provide a technically feasible potential conceptual engineering design scenario;
   (g) updating each technically feasible potential conceptual engineering design scenario and associated unique type model over time using a computer processor by at least one of (1) adjusting each technical variable and each economic variable for the respective unique type model according to currently available economic data and technical data that is related to a respective adjusted variable and (2) adding at least one of one or more economic variables and one or more technical variables to the respective unique type model according to the currently available economic data and technical data that is related to a respective added variable to obtain an updated technically feasible potential conceptual engineering design scenario;
   (h) refining each updated type model by adjusting each technical variable and each economic variable for the respective updated type model according to the initial technical feasibility analysis for the respective updated technically feasible potential conceptual engineering design scenario that is related to a respective adjusted variable;
   (i) calculating a net present value for each updated technically feasible potential conceptual engineering design scenario;
   (j) ranking the updated technically feasible potential conceptual engineering design scenario in order of its respective net present value;
   (k) eliminating each ranked updated technically feasible scenario from step (j) that is not economical;
   (l) identifying one or more remaining potential conceptual engineering design scenarios that are both technically feasible and economical according to the respective technical feasibility analysis and its respective ranked net present value, wherein each identified remaining potential conceptual engineering design scenario represents both a technically feasible, economical scenario;

(m) re-updating each refined type model associated with each respective both technically feasible, economical scenario by at least one of (A) adjusting each technical variable and each economic variable for the respective refined type model according to any additional economic data and technical data that is related to a respective adjusted variable and (B) adding at least one of one or more economic variables and one or more technical variables to the respective refined type model according to any additional economic data and technical data that is related to a respective added variable;

(n) re-updating each ranked net present value for the respective both technically feasible, economical scenario;

(o) identifying a list of the most profitable, technically feasible, economic scenarios from step (n);

(p) submitting each profitable scenario identified on the list from step (o) to one or more engineering, procurement and construction contractors for bidding; and (q) selecting a best profitable engineering design scenario from the both technically feasible, economical scenarios based on at least one of the respective re-updated net present value and a respective acceptable project bid from an engineering procurement and construction contractor that includes a project timeline estimate for developing components required to produce at least one of oil and gas from the potential target asset;

(r) executing the acceptable project bid for the potential asset target including procurement of at least one capital equipment.

2. The method of claim 1, wherein each ranked net present value updated technically feasible potential conceptual engineering design scenario of step (j) is ranked with a net present value for each corporate portfolio asset.

3. The method of claim 1, wherein the potential oil and gas field asset target contains at least one of oil and gas deposits, which is one of a previously undiscovered asset, an asset under active exploration or development, a producing asset and a previously abandoned asset.

4. The method of claim 1, wherein each unique type model represents an integrated asset model, which includes a consolidated technical description of at least one of a reservoir, a wellbore and surface production facilities associated with the potential asset target, and baseline economic data associated with the potential asset target.

5. The method of claim 1, further comprising:
re-refining each re-updated type model by adjusting each technical variable for the respective re-updated type model according to a front end engineering design study for the respective technically feasible, economical scenario that is related to a respective adjusted variable; and
using the respective re-refined type model to update each ranked net present value for the respective technically feasible, economical scenario.

6. The method of claim 1, further comprising:
ranking a net present value for each corporate portfolio asset and the updated net present value for the best profitable engineering scenario; and
comparing the updated net present value rank for the best profitable engineering design scenario with a corporate portfolio capital spending budget.

7. The method of claim 6, further comprising executing the project bid based on the comparison of the updated net present value rank for the best profitable engineering design scenario and the corporate portfolio capital spending budget.

8. A non-transitory program carrier device tangibly carrying computer-executable instructions for selecting an engineering design scenario for a potential oil and gas asset target by total asset modeling, the instructions being executable to implement:

(a) selecting a potential oil and gas field target asset;

(b) generating a list of potential conceptual engineering design scenarios for the potential asset target selected in step (a);

(c) retrieving from a library a unique type model;

(d) associating the retrieved unique type model with each potential conceptual engineering design scenario wherein, wherein each unique type model includes one or more economic variables and one or more technical variables;

(e) performing an initial technical feasibility analysis on each potential conceptual engineering design scenario from step (d);

(f) evaluating and removing each potential conceptual engineering design scenario from step (e) that is not technically feasible to provide a technically feasible potential conceptual engineering design scenario;

(g) updating each technically feasible potential conceptual engineering design scenario and associated unique type model over time using a computer processor by at least one of (1) adjusting each technical variable and each economic variable for the respective unique type model according to currently available economic data and technical data that is related to a respective adjusted variable and (2) adding at least one of one or more economic variables and one or more technical variables to the respective unique type model according to the currently available economic data and technical data that is related to a respective added variable to obtain an updated technically feasible potential conceptual engineering design scenario;

(h) refining each updated type model by adjusting each technical variable and each economic variable for the respective updated type model according to the initial technical feasibility analysis for the respective updated technically feasible potential conceptual engineering design scenario that is related to a respective adjusted variable;

(i) calculating a net present value for each updated technically feasible potential conceptual engineering design scenario;

(j) ranking the updated technically feasible potential conceptual engineering design scenario in order of its respective net present value;

(k) eliminating each ranked updated technically feasible scenario from step (j) that is not economical;

(l) identifying one or more remaining potential conceptual engineering design scenarios that are both technically feasible and economical according to the respective technical feasibility analysis and its respective ranked net present value, wherein each identified remaining potential conceptual engineering design scenario represents both a technically feasible, economical scenario;

(m) re-updating each refined type model associated with each respective both technically feasible, economical scenario by at least one of (A) adjusting each technical variable and each economic variable for the respective refined type model according to any additional economic data and technical data that is related to a respective adjusted variable and (B) adding at least one of one or more economic variables and one or more technical variables to the respective refined type model according to any additional economic data and technical data that is related to a respective added variable;

(n) re-updating each ranked net present value for the respective both technically feasible, economical scenario; and (o) identifying a list of the most profitable, technically feasible, economic scenarios from step (n);

(p) submitting each profitable scenario identified on the list from step (o) to one or more engineering, procurement and construction contractors for bidding; and (q) selecting a best profitable engineering design scenario from the both technically feasible, economical scenarios based on at least one of the respective re-updated net present value and a respective acceptable project bid from an engineering procurement and construction contractor that includes a project timeline estimate for developing components required to produce at least one of oil and gas from the potential target asset;

(r) executing the acceptable project bid for the potential asset target including procurement of at least one capital equipment.

9. The program carrier device of claim 8, wherein each ranked net present value updated technically feasible potential conceptual engineering design scenario of step (j) is ranked with a net present value for each corporate portfolio asset.

10. The program carrier device of claim 8, wherein the potential asset target contains at least one of oil and gas deposits, which is one of a previously undiscovered asset, an asset under active exploration or development, a producing asset and a previously abandoned asset.

11. The program carrier device of claim 8, wherein each unique type model represents an integrated asset model, which includes a consolidated technical description of at least one of a reservoir, a wellbore and surface production facilities associated with the potential asset target, and baseline economic data associated with the potential asset target.

12. The program carrier device of claim 8, further comprising:

re-refining each re-updated type model by adjusting each technical variable for the respective re-updated type model according to a front end engineering design study for the respective technically feasible, economical scenario that is related to a respective adjusted variable; and using the respective re-refined type model to update each ranked net present value for the respective technically feasible, economical scenario.

13. The program carrier device of claim 8, further comprising:

ranking a net present value for each corporate portfolio asset and the updated net present value for the best profitable engineering scenario; and comparing the updated net present value rank for the best profitable engineering design scenario with a corporate portfolio capital spending budget.

14. The program carrier device of claim 12, further comprising executing the project bid based on the comparison of the updated net present value rank for the best profitable engineering design scenario and the corporate portfolio capital spending budget.

15. The program carrier device of claim 8, further comprising:

ranking a net present value for each corporate portfolio asset and the updated net present value for the best profitable engineering scenario; and comparing the updated net present value rank for the best profitable engineering design scenario with a corporate portfolio capital spending budget.

16. The program carrier device of claim 15, further comprising executing the project bid based on the comparison of the updated net present value rank for the best profitable engineering design scenario and the corporate portfolio capital spending budget.

17. The program carrier device of claim 8, wherein each ranked net present value updated technically feasible potential conceptual engineering design scenario of step (j) is ranked with a net present value for each corporate portfolio asset.

18. The program carrier device of claim 8, wherein the potential asset target contains at least one of oil and gas deposits, which is one of a previously undiscovered asset, an asset under active exploration or development, a producing asset and a previously abandoned asset.

19. The program carrier device of 8, wherein each unique type model represents an integrated asset model, which includes a consolidated technical description of at least one of a reservoir, a wellbore and surface production facilities associated with the potential asset target, and baseline economic data associated with the potential asset target.

* * * * *